US010784675B2

(12) United States Patent
Hewelt et al.

(10) Patent No.: US 10,784,675 B2
(45) Date of Patent: Sep. 22, 2020

(54) VEHICLE ACCESSORY POWER SWITCH

(71) Applicant: DRIVE CREEK LLC, Vernon, MI (US)

(72) Inventors: Scott Hewelt, China Township, MI (US); Kevin Hibbard, Vernon, MI (US)

(73) Assignee: DRIVE CREEK LLC, Vernon, MI (US)

( * ) Notice: Subject to any disclaimer, the term of this patent is extended or adjusted under 35 U.S.C. 154(b) by 374 days.

(21) Appl. No.: 15/654,349

(22) Filed: Jul. 19, 2017

(65) Prior Publication Data
US 2018/0026437 A1 Jan. 25, 2018

Related U.S. Application Data

(60) Provisional application No. 62/364,119, filed on Jul. 19, 2016.

(51) Int. Cl.
H01H 9/16 (2006.01)
H02H 7/05 (2006.01)
H03K 17/0814 (2006.01)
H02H 3/04 (2006.01)
B60R 16/023 (2006.01)
H03K 17/95 (2006.01)
H01H 85/32 (2006.01)
H01H 85/20 (2006.01)

(52) U.S. Cl.
CPC .............. H02H 7/05 (2013.01); H01H 9/162 (2013.01); H02H 3/046 (2013.01); H03K 17/08142 (2013.01); B60R 16/0238 (2013.01); H01H 85/32 (2013.01); H01H 2085/208 (2013.01); H03K 2017/9507 (2013.01)

(58) Field of Classification Search
CPC .. H01H 9/162; H01H 2085/208; H01H 85/32; H02H 3/046; H02H 7/05; H03K 17/08142; H03K 2017/9507; B60R 16/0238
USPC .......................... 307/9.1, 10.1; 361/93.7, 160
See application file for complete search history.

(56) References Cited

U.S. PATENT DOCUMENTS 7,477,502 B1 * 1/2009 Faulkner ................ H02H 3/033
361/93.7

OTHER PUBLICATIONS

Car battery voltage monitor, pp. 1-3 (Year: 2014).*

* cited by examiner

Primary Examiner — Rexford N Barnie
Assistant Examiner — Toan T Vu
(74) Attorney, Agent, or Firm — Greenberg Traurig, LLP

(57) ABSTRACT

An electrical switch for providing power from a power source to a component may include a voltage supervisor having an input and an output, a voltage divider, electrically coupled between the input of the voltage supervisor and ground, an RC filter electrically coupled to the output of the voltage supervisor, and a field-effect transistor having a first terminal coupled to the RC filter and a second terminal coupled to an output of the switch, the output configured to be electrically coupled to the component. A switch may additionally or alternatively include a light source electrically that emits light when power is provided from the input of the switch to the component, the light source arranged proximate a fuse so as to illuminate the fuse.

8 Claims, 5 Drawing Sheets

VEHICLE ACCESSORY POWER SWITCH

CROSS-REFERENCE TO RELATED APPLICATION

This application claims the benefit of priority to U.S. provisional application No. 62/364,119, filed Jul. 19, 2016.

FIELD OF THE DISCLOSURE

This disclosure is generally directed to vehicle components, including power switches for vehicle accessories.

BACKGROUND

Aftermarket automotive fuses are available with an internal LED that illuminates when the fuse has failed. Typically, the fuse-box in a vehicle has a matrix of fuses. When a fuse fails, it is difficult to identify what particular fuse failed. By inserting a known fuse with LED indication, the failed fuse will illuminate, identifying it as needing replacement.

SUMMARY

An embodiment of an electrical switch for providing power from a power source to a component may include a voltage supervisor having an input and an output, a voltage divider, electrically coupled between the input of the voltage supervisor and ground, an RC filter electrically coupled to the output of the voltage supervisor, and a field-effect transistor having a first terminal coupled to the RC filter and a second terminal coupled to an output of the switch, the output configured to be electrically coupled to the component.

An embodiment of an electrical switch for providing power from an input to a component may include an electrical circuit, a fuse electrically coupled to the electrical circuit, and a light source electrically coupled to the electrical circuit so as to emit light when the circuit is closed and power is provided from the input to the component, the light source arranged proximate the fuse so as to illuminate the fuse.

DESCRIPTION

The inventors of the instant disclosure have identified a need for an accessory switch that improves upon known aftermarket automotive fuses and power access points in vehicles. First, the arrangement of known fuses, which illuminate upon failure, are susceptible to error, as it is possible that the fuse may fail to illuminate if the light source also fails (resulting in a false negative). Second, known power access points in vehicles may be difficult to access to install or replace aftermarket accessories. Third, known fuses or power access points in vehicles may require either manual connection and disconnection by a user to provide power to an accessory, or may permit an undesirable amount of parasitic current draw while the vehicle is powered off, thereby draining the vehicle battery.

Figure 1:
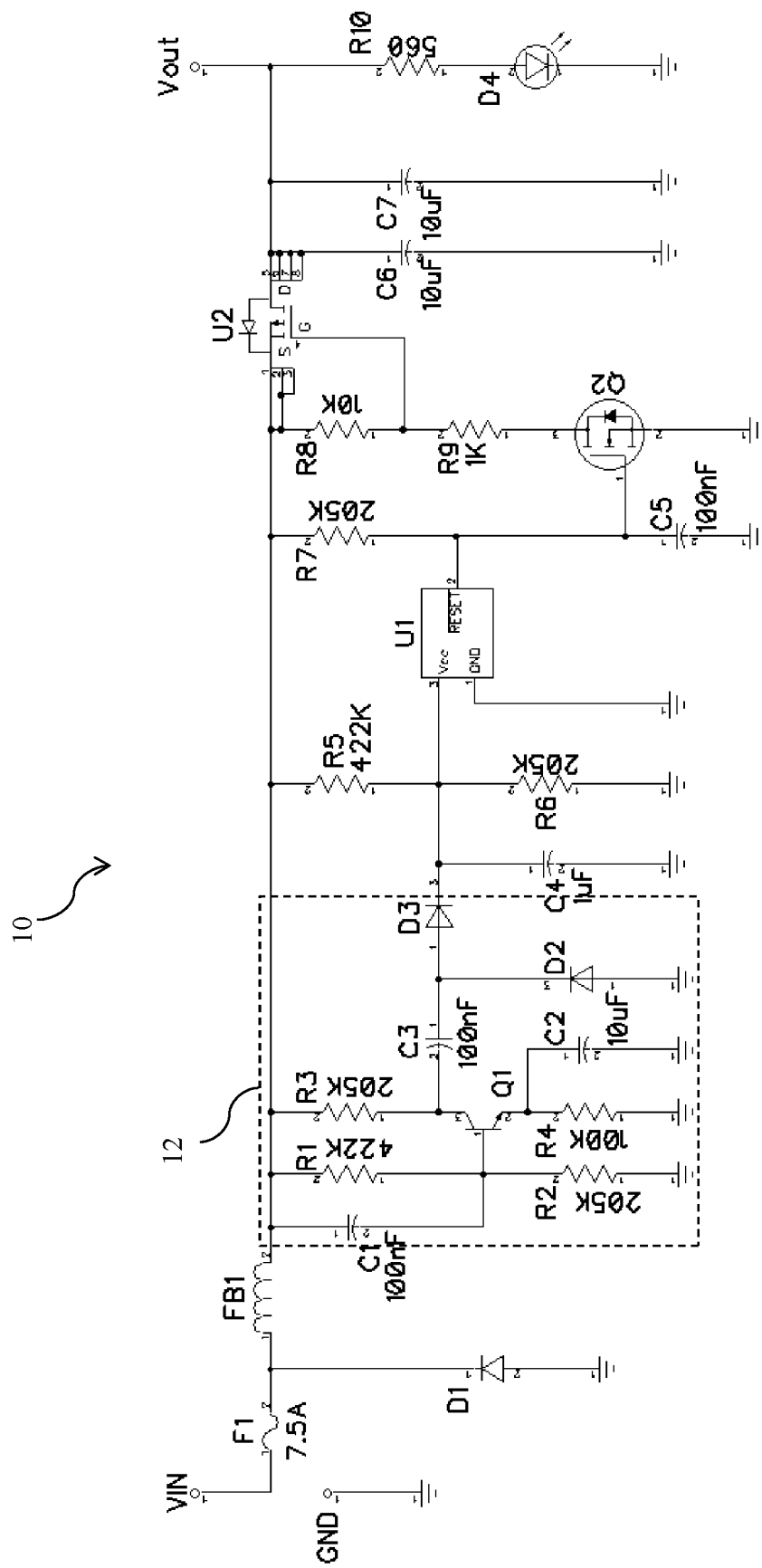
FIG. 1 is a circuit diagram of an example electrical switch.

A power switch according to the present disclosure may address one or more of the above-noted shortcomings of known fuse and power access arrangements in vehicles. FIG. 1 is a circuit diagram of an illustrative example embodiment of a switch 10. The switch 10 may find use, for example, in providing power from a power source, such as a vehicle battery, to one or more accessories installed in a vehicle. Referring to FIG. 1, battery voltage (power input) enters the circuit at $V_{IN}$ and GND. F1 is an appropriate sized FUSE that is PCB mounted using standard fuse terminals. The F1 fuse amperage is matched to the other corresponding components for desired output current to the load. D1 is a reverse-biased protection diode to the circuit. If reverse-bias power is attached, D1 becomes forward-biased and shunts the reverse current to ground. The F1 FUSE will "open" due to the direct path to ground, thus saving circuitry from damage from reverse-bias power. By shunting D1 diode to ground instead of D1 diode placed in Series eliminates the $V_f$ forward voltage drop of the diode, delivering a higher voltage to the load.

FB1 is a ferrite-bead filter, attenuating any high-frequency noise, pulses or electrical transients from being passed through the circuit. FB1 placement before the Voltage Supervisor U1 and driver MOSFET U2, reducing the chance of noise enabling the circuit and attenuating any HF to the device load.

Resistors R5 and R6 are configured as a voltage-divider, setting bias for the U1 voltage supervisor. U1 also presents an input impedance in parallel with R6. Resistance divider values may be selected to be very high impedance to reduce the parasitic current drawn from the battery when sleeping. For example, the U1 input impedance, combined with the bias of the AC amplifier circuit 12, and a 12V input, may have a combined input impedance that result in a quiescent current draw of ~140 uA, in an embodiment. Typical automotive 12V batteries are rated at ~50 Ah. This means the battery can supply 1A of current for 50 hours before the battery charge is depleted. With ~140 uA quiescent current draw when the engine is OFF, a typical automotive battery has enough charge to provide current for over 350,000 hours. This equates to 15,000 days or 40 years.

It should be noted that the specific components and values of components disclosed herein could be modified, replaced, etc. as necessary for different applications. For example, although R5, R6, and other components are described above with respect to specific example values tailored to an application in which a 12V automotive battery is a power source, those values could be modified in other embodiments for other power sources to achieve an appropriate ON/OFF voltage for U1 and an appropriately low quiescent current draw. In embodiments, R5, R6, and U1 may be selected to accommodate a power supply providing a voltage of 5V or more. For example, the values of R5 and R6 and component selected for U1 may be selected to accommodate a 24V DC power source (such as that commonly used in long haul trucks and busses) or a 48V DC power source (as in many electric vehicles).

Voltage supervisors are common components used in power-supplies/micro-processor monitoring and are available in a variety of enable-voltage thresholds. In an embodiment, R5 and R6 are biased, in conjunction with the input impedance of U1, to trigger the U1 supervisor when the Vin voltage exceeds a threshold, such as ~13.5V, for example. The U1 supervisor output remains at Ground potential until the Vcc input threshold is exceeded. The U1 supervisor may have internal hysteresis, thus the turn OFF input voltage value may be ~12.8V. R5, R6 and the U1 supervisor threshold values may be selected such that the output of the U1 supervisor remains disabled when the input is at or below a threshold, such as ~12.8 V, for example, and enabled with the input is at or above another threshold, such as ~13.5V, in an embodiment, when the input battery is a 12V battery, for example. As a result, the 12V typically supplied by an automotive battery while in steady-state will not activate the U2 supervisor, whereas the ~13.8V-14.2V typically supplied by an automotive battery while the battery is charging (e.g., as a result of the vehicle running) will enable the U1 supervisor. In other words, the switch is configured to distinguish between the voltage level of a typical 12V automotive battery when charging (engine running and alternator charging battery) v. engine not running or not charging, whereby the battery exists in a steady state. In embodiments, the voltage supervisor and other components of the switch may be configured to accommodate a battery having a different steady state voltage and/or charging voltage. As a result, the switch minimizes current draw while the engine is off and automatically activate and provide power to the load (e.g., one or more accessories) when the engine is turned on.

Resistor R7 and capacitor C5 provide a low-pass RC filter into the gate of Q2 as well as setting the Q2 gate bias. The resistance value of resistor R7 is selected to be large enough to minimize parasitic quiescent currents during sleep mode, in an embodiment. The RC filter reduces electrical noise to the Q2 gate, reducing the chance of enabling the N-channel MOSFET due to electrical noise, pulses, transients, etc., from the alternator or other devices that may cause noise on the $V_{IN}$ power-line. The supervisor output (typically a transistor collector) is at ground potential when $V_{CC}$ voltage is below the enable threshold. When the $V_{IN}$ voltage exceeds 13.6V, the U1 supervisor activates (open collector), allowing R7/C5 to forward bias the gate of the Q2 MOSFET.

Q2 is a typical low current N-channel switching MOSFET, in an embodiment. When $V_{IN}$ is below the 13.5V enable threshold, the U1 supervisor output is at ground potential. Once $V_{IN}$ exceeds the 13.5V threshold, the supervisor output opens, providing bias to the N-channel Q2 gate, turning ON Q2.

Resistors R8 and R9 provide the bias for the U2 output driver for Vout. Q2 provides the ground signal to resistor R9. Reducing the divider voltage to the gate of U2 forward biases the P-channel gate, enabling U2 into conduction. When U2 is enabled, the output provides current to the load ($V_{OUT}$) of the switch. U2 is a p-channel driver MOSFET, in an embodiment, which provides the main switching of $V_{OUT}$ power to the load. U2 is sized to match the maximum output current delivery of the circuit components (D1, F1, FB1, U1) as well as the copper trace widths, PCB thermal characteristics, etc., in an embodiment. The ratio of the respective resistance values of resistors R8 and R9 may be selected to keep the U2 $V_{GS}$ value within specification, and may change depending upon the MOSFET type selected.

C6 and C7 are filter capacitors used to minimize transients and load variations at the $V_{OUT}$ terminal, in an embodiment. Typically, with a battery source and a low-impedance feed, they will function as low-pass filters, reducing high-frequency noise to the load.

Resistor R10 and diode D4 are the LED indication components, in an embodiment. When the $V_{IN}$ voltage exceeds 13.5V, U2 is enabled, and the D4 LED will illuminate. Accordingly, the switch of FIG. 1 improves upon known automotive fuses by illuminating when the switch is active, rather than when in a failure state, thus eliminating the ambiguity between a blown fuse and a failed LED present in known fuses. The R10 resistance value determines the D4 LED intensity, in an embodiment. D4 may be physically positioned near the fuse (e.g., proximate the fuse body terminal location). The D4 LED may be any color. In an embodiment, the LED color selected may match or resemble the color or tint of the body of the fuse F1, which body may be plastic. The F1 fuse may be a standard typical automotive grade (ATC, ATM) fuse. Automotive fuses are generally manufactured using molded semi-transparent plastic with colors that indicate their fuse amperage. An LED color that closely matches the fuse body color may maximize the illumination of the fuse body, with the plastic body of the fuse acting as a filter for the light from the LED.

The fuse body, which may be a translucent plastic material, may be illuminated by the close proximity of D4 LED. For example, a 7.5 A automotive fuse is generally a brown translucent plastic. By placing D4 LED near the fuse body, the fuse body may act as a diffused light-pipe or lens for the LED. The LED selected for the 7.5 A may be an orange color, for example, which most closely matches the brown tint color of the 7.5 A fuse body of available LED colors. When the output $V_{OUT}$ is enabled, the orange LED light will illuminate the fuse body, indicating that POWER is ON and being delivered to the output load. This fuse-body illumination is an indication to the user that the output is active, providing a diagnostic feedback feature using common automotive fuse characteristics. The fuse may protrude partially outside the enclosure body of the switch. The terminals for the fuse may be internal to the switch enclosure and protected from contact. The fuse is accessible for replacement by pulling directly out of the enclosure or contacts. The fuse body protrusion provides the LED illumination effects for diagnosis, using the fuse body as a light-pipe or lens.

Figure 3:
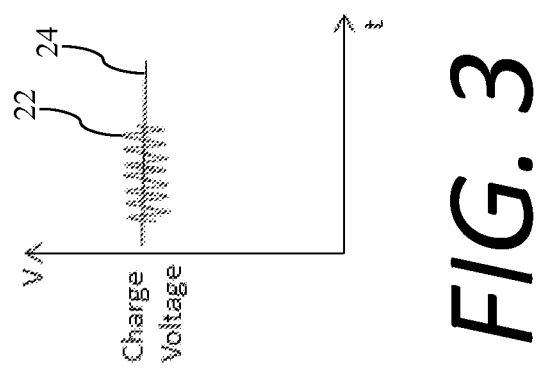
FIG. 3 is a plot illustrating an output signal from a battery that may be utilized by an electrical switch according to this disclosure.

The switch 10 may include an AC noise amplifier 12, in an embodiment. The amplifier 12 may enable a power switch according to the present disclosure to be reliably used on lower level output charging systems like Moped scooters, motorcycles, side-by-sides, go-carts, small watercraft, and other vehicles that use a lower level 12V output charging, such as an alternator or magneto charging system. Such vehicles typically have a relatively small differential between the charging voltage of the battery and the steady-state voltage of the battery. However, as illustrated in FIG. 3, when the alternator is active to charge the battery, an AC noise component 22 is introduced on the DC output 24 of the battery. Accordingly, a circuit having an AC noise amplifier 12, which detects and amplifies AC noise from the alternator and adds the amplified noise to the input voltage, can enable better detection of when the engine is switched on.

Referring again to FIG. 1, AC noise from the alternator of the vehicle is present on the $V_{IN}$ input voltage from the battery and is amplified through the amplifier circuit 12 containing transistor Q1. The output signal is rectified through diodes D2/D3 and summed into the node comprising resistors R5 and R6, capacitor C4, and voltage supervisor U1, with the existing DC charging level bias voltage from the battery. The rectified voltage increases the existing DC threshold at the junction when the alternator is powered on, thereby increasing the margin between the engine-on state and the engine-off state and therefore also increasing the reliability of the comparison made by the voltage supervisor U1. In an embodiment, the lower threshold (that triggers the switch from off to on) can be increased to guarantee OFF when charging stops, while still having sufficient margin of upper voltage to enable circuit to turn ON.

Functionally, the amplifier 12 amplifies the alternator "noise," the AC pulses typically present when the battery is being charged. The AC noise is amplified & rectified to DC, then "summed" with the threshold level of the voltage supervisor U1. As a result, a switch with an amplifier can better detect a "motor on" status of vehicles with lower output charging systems voltage differentials between charging and steady-state, such as motorcycles, side-by-side, 4-wheeler, lawn-mowers (and other machines having smaller non-automotive engines), etc.

In an embodiment, a switch according to the present disclosure may omit the amplifier circuit 12. For example, an amplifier circuit may not be necessary where the switch is used in a car, truck, or other vehicle with a relatively large differential between the charging voltage of the battery and the steady-state voltage of the battery. A person of skill in the art will appreciate how to configure such a circuit based on the teachings of this disclosure.

Additional or alternative functions can be included in the switch 10, in embodiments, such as LED sequential blinking, cycling, or flashing to indicate other diagnostic codes or functional features. The switch may include LED control circuitry for such functionality, in embodiments. Furthermore, individual circuit components can be changed for various output current delivery. For example, with a standard 5 amp fuse, which is generally red, D4 may use a red LED. In contrast, with a 20 amp fuse, which is generally yellow, D4 may use a yellow LED to best illuminate the fuse body. A clear LED could also be used as a common color to illuminate various body color fuses. Furthermore, the resistance, capacitance, and other values and features of the individual components of the switch 10 may be customized to the voltage provided by a given input source.

Figure 2:
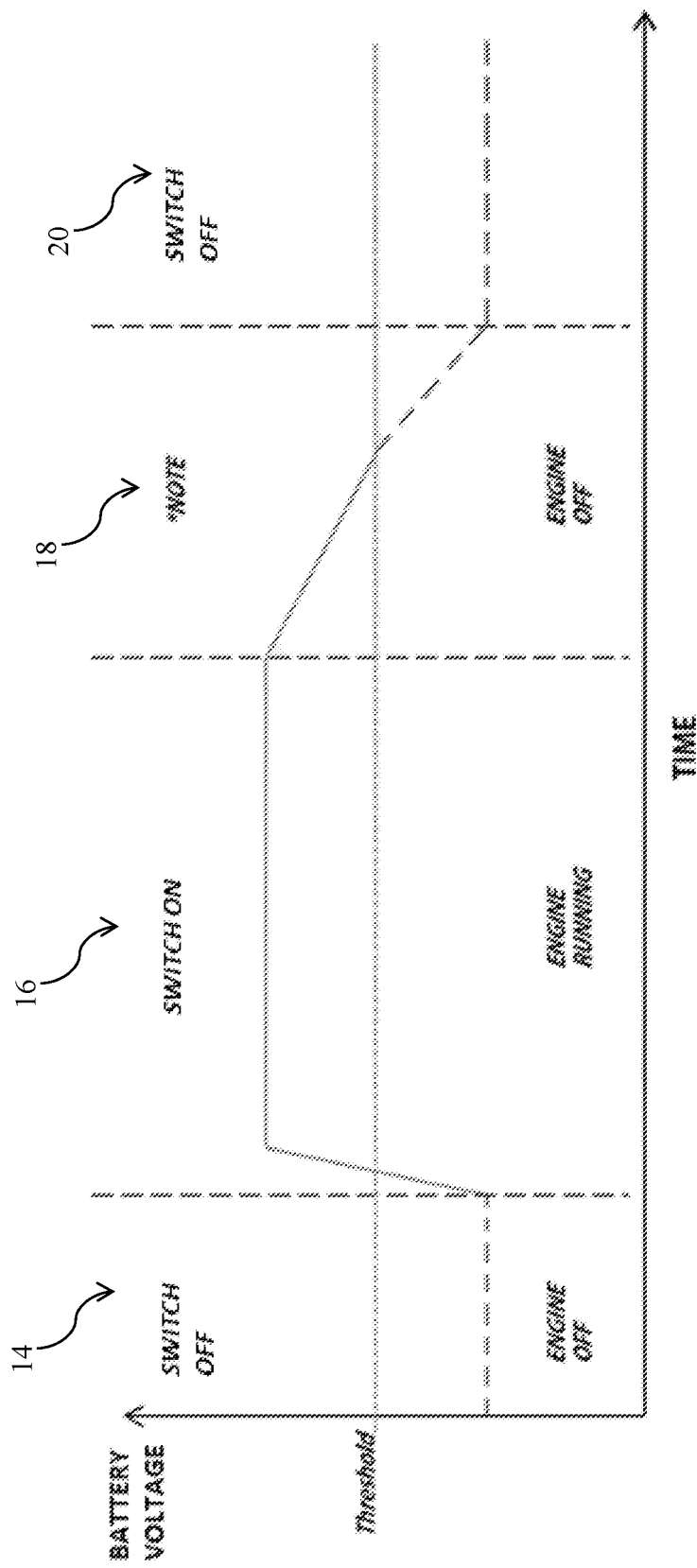
FIG. 2 is a plot illustrating electrical behavior of an example electrical switch according to FIG. 1.

FIG. 2 is a plot illustrating electrical behavior of an example power switch, such as a switch constructed according to the circuit diagram and description of FIG. 1. As illustrated in FIG. 2, in a first state 14 in which the vehicle engine is off, the switch is also off. In a second state 16 in which the vehicle engine is switched on from an off state, the switch is powered on at substantially the same time as the engine, and remains on as the battery voltage rises in response to the alternator being switched on and as the battery remains at its steady-state voltage. In a third state 18, when the vehicle is powered off after being on, the switch may remain on until the battery output voltage drops below a threshold (e.g., below a charging voltage, such as 12.8 V, for example), at which point the switch also powers off (as indicated by the transition from a solid line to a dashed line). Finally, in a fourth state 20 that is the same as the first, both the engine and the switch are powered off.

Figure 4:
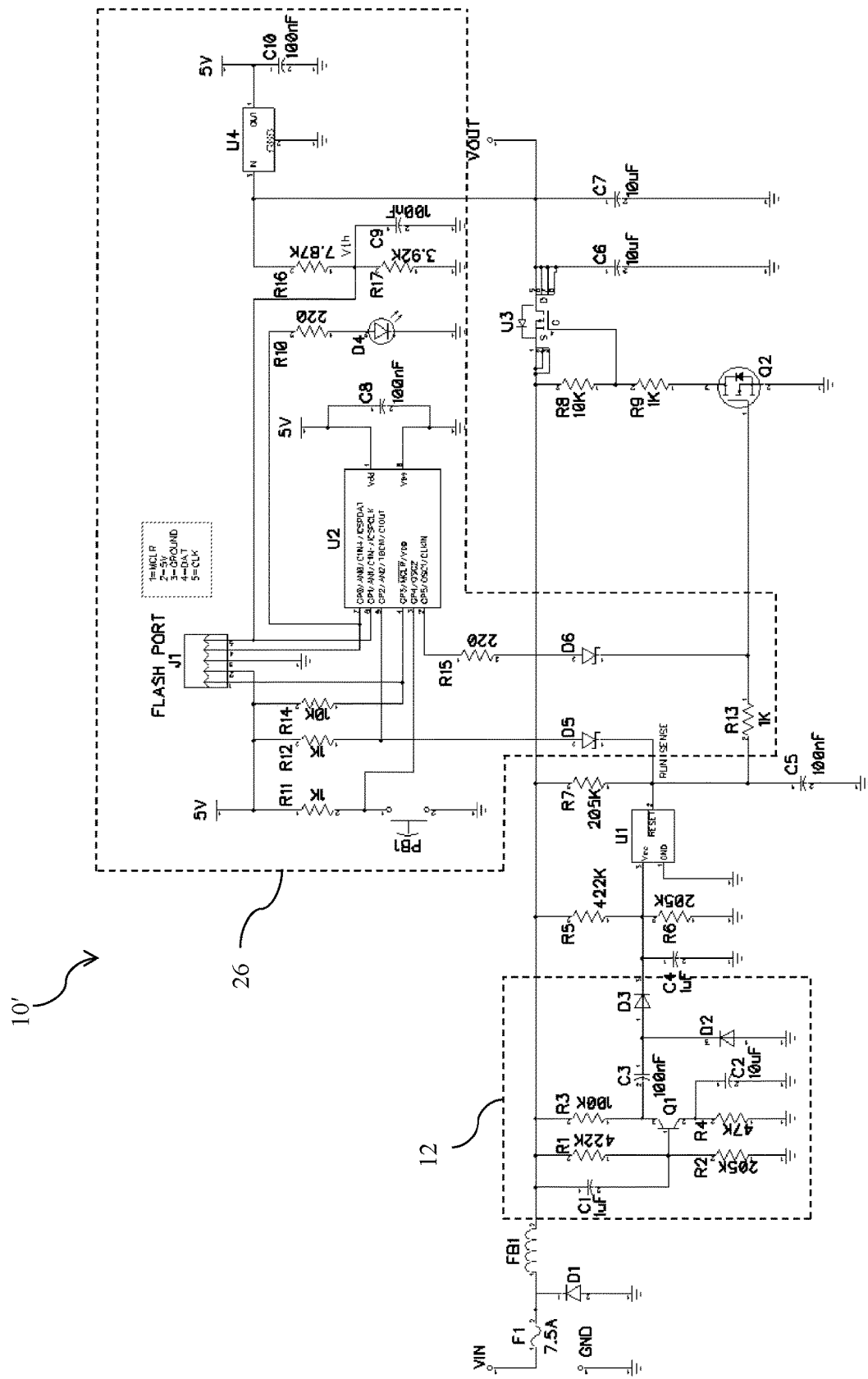
FIG. 4 is a circuit diagram of an example electrical switch including a microcontroller-based timer.
Figure 5:
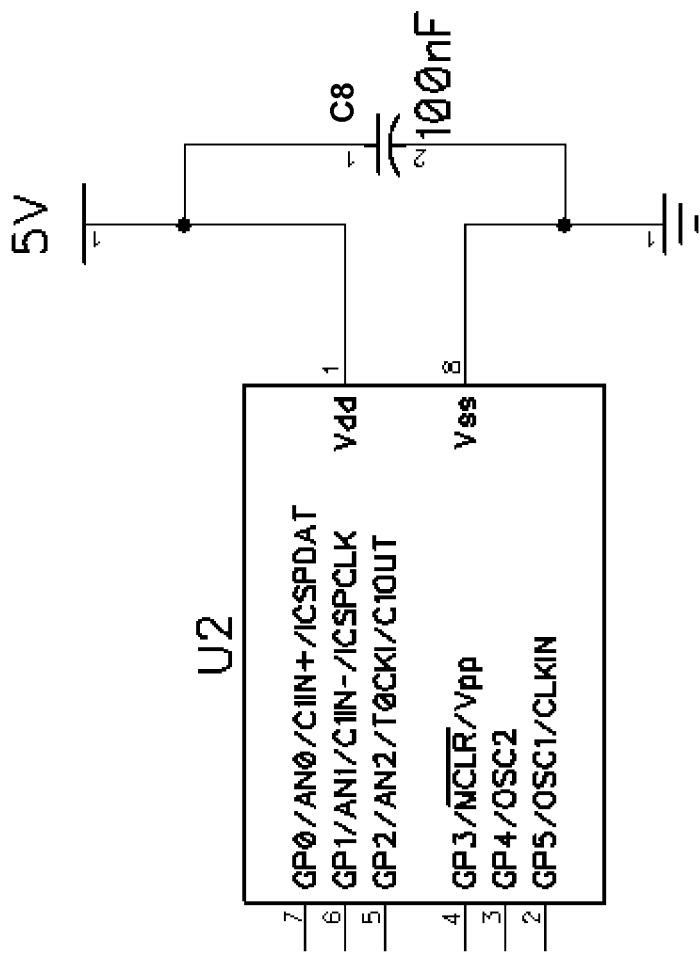
FIG. 5 is an enlarged view of a microcontroller that may find use in the circuit of FIG. 4.

FIG. 4 is a circuit diagram of an example electrical switch 10' including a microcontroller-based timer. The example circuit 10' of FIG. 4 may be the same as the example circuit 10 of FIG. 1, but with the addition of a microcontroller-based timer circuit 26. In an embodiment, a circuit having a timer circuit 26, may be used according to the teachings of this disclosure. A person of skill in the art will appreciate how to configure such a circuit based on the teachings of this disclosure.

In the circuit 10' of FIG. 4, the output node of voltage supervisor U1 may be referred to as the "RUN SENSE" node, as it provides an indication of whether the engine is running.

When the input voltage at $V_{IN}$ is above a given threshold (i.e., the charging-battery threshold that indicates that the vehicle engine is running), pin 2 on component U1 goes to high impedance, turning on MOSFET Q2, enabling MOSFET U2 to conduct, and activating voltage regulator U4 and microcontroller U2.

Upon activation of microcontroller U2, GP5/PIN-2 of microcontroller U2 goes HIGH (LATCH), keeping MOSFET Q2 on.

LATCH remains enabled on the microcontroller U2 even if the input voltage $V_{IN}$ drops below the threshold and RUN SENSE goes to ground, in an embodiment.

In an embodiment, while input voltage $V_{IN}$ is above the threshold (i.e., while RUN-SENSE is HIGH), the microcontroller does nothing other than maintain GP5/PIN-2 at LATCH output HIGH and monitor RUN SENSE node at pin GP2 (i.e., the DIGITAL INPUT pin).

When the input voltage $V_{IN}$ drops below the threshold, the RUN SENSE node goes to GROUND, and the microcontroller U2, at pin GP2, will detect the transition from HIGH to LOW. In response, the microcontroller U2 will begin an internal timer countdown and will hold the LATCH GP5/PIN-2 HIGH until the timer elapses. Once the timer elapses, microcontroller U2 will output LOW at GP5/PIN-2 (i.e., will open the latch), turning OFF MOSFETs Q2 and U3 and cutting the output voltage of the switch.

In summary, the microcontroller U2 is configured to monitor the circuit for a voltage indicative of the vehicle motor being switched from ON to OFF and, in response, both maintaining an output voltage for the switch such that the switch continues to output a functional output voltage (e.g., for an accessory connected to the switch) and initiating a countdown timer. Once the timer is expired, the microcontroller cuts the output voltage for the switch.

The amount of time used in the countdown timer by the microcontroller U2 may be user-programmable, in an embodiment. For example, in an embodiment, a push-button may be provided on the switch 10' (labeled as "PB1" in FIG. 4), and the microcontroller may be programmed to enter one of two or more different timer states (each with a particular amount of time for the timer) responsive to user manipulation of the button. For example, the timer may be user-programmable to a discrete number of minutes, in an embodiment. Furthermore, in an embodiment, the microcontroller may be programmed to disable the timer countdown responsive to user input, such that the circuit of FIG. 4 functions in a particular mode in the same fashion as the circuit of FIG. 1.

If the input voltage $V_{IN}$ increases above the threshold during the timer countdown, the microcontroller U2 detects the high voltage, and the microcontroller may be configured to cease the timer countdown and maintain the output voltage for the switch.

In conjunction with a countdown timer, or instead of a countdown timer, the microcontroller U2 may be programmed to monitor the voltage output by the battery (i.e., $V_{IN}$ through divider R16, R17, labeled as $V_{th}$) and disable the output of the switch if the battery level decreases below a pre-determined voltage level. In such a mode, the switch may enable the battery to continue to deliver power to an accessory or electronic device without the vehicle engine running and without the user having to fear having a dead battery when the engine needs to be started. A person of skill in the art will appreciate how to program the microcontroller U2 in order to monitor the voltage of the battery as a condition, instead of or in addition to using a timer.

The switches illustrated in FIGS. 1 and 4 and described herein are examples only. Numerous changes may be made to the switch and remain within the spirit and scope of the present disclosure. Although numerous components and properties are described herein as definite, with language such as "is", "are", "will", and the like, it should be understood that such components are properties are examples only.

While this disclosure has described certain embodiments, it will be understood that the claims are not intended to be limited to these embodiments except as explicitly recited in the claims. On the contrary, the instant disclosure is intended to cover alternatives, modifications and equivalents, which may be included within the spirit and scope of the disclosure. Furthermore, in the detailed description of the present disclosure, numerous specific details are set forth in order to provide a thorough understanding of the disclosed embodiments. However, it will be obvious to one of ordinary skill in the art that systems and methods consistent with this disclosure may be practiced without these specific details. In other instances, well known methods, procedures, components, and circuits have not been described in detail as not to unnecessarily obscure various aspects of the present disclosure.

Some portions of the detailed descriptions of this disclosure have been presented in terms of procedures, logic blocks, processing, and other symbolic representations of operations on data bits within a computer or digital system memory. These descriptions and representations are the means used by those skilled in the data processing arts to most effectively convey the substance of their work to others skilled in the art. A procedure, logic block, process, etc., is herein, and generally, conceived to be a self-consistent sequence of steps or instructions leading to a desired result. The steps are those requiring physical manipulations of physical quantities. Usually, though not necessarily, these physical manipulations take the form of electrical or magnetic data capable of being stored, transferred, combined, compared, and otherwise manipulated in a computer system or similar electronic computing device. For reasons of convenience, and with reference to common usage, such data is referred to as bits, values, elements, symbols, characters, terms, numbers, or the like, with reference to various embodiments of the present invention.

It should be borne in mind, however, that these terms are to be interpreted as referencing physical manipulations and quantities and are merely convenient labels that should be interpreted further in view of terms commonly used in the art. Unless specifically stated otherwise, as apparent from the discussion herein, it is understood that throughout discussions of the present embodiment, discussions utilizing terms such as "determining" or "outputting" or "transmitting" or "recording" or "locating" or "storing" or "displaying" or "receiving" or "recognizing" or "utilizing" or "generating" or "providing" or "accessing" or "checking" or "notifying" or "delivering" or the like, refer to the action and processes of a computer system, or similar electronic computing device, that manipulates and transforms data. The data is represented as physical (electronic) quantities within the computer system's registers and memories and is transformed into other data similarly represented as physical quantities within the computer system memories or registers, or other such information storage, transmission, or display devices as described herein or otherwise understood to one of ordinary skill in the art.

What is claimed is:

1. An electrical switch for providing power from a power source to a component, the switch comprising:
    a voltage supervisor having an input and an output;
    a voltage divider, electrically coupled between the input of the voltage supervisor and ground;
    an RC filter electrically coupled to the output of the voltage supervisor;
    a field-effect transistor having a first terminal coupled to the RC filter and a second terminal coupled to an output of the switch, the output configured to be electrically coupled to the component;
    a fuse; and
    a light source arranged proximate the fuse so as to illuminate the fuse when provided with power from the power source, wherein the light source is electrically coupled to the output.

2. The electrical switch of claim 1, further comprising the power source, wherein the power source is a battery.

3. The electrical switch of claim 2, wherein the power source is an automotive battery.

4. The electrical switch of claim 3, wherein the voltage divider comprises two resistors having a combined resistance of 600 kΩ or more.

5. The electrical switch of claim 4, wherein the voltage supervisor is configured to remain at ground potential when the voltage supervisor input voltage is greater than 13.5V.

6. The electrical switch of claim 1, further comprising a microcontroller configured to maintain an output voltage of the switch that is suitable to power the component for a defined period of time after the voltage at an input terminal of the switch falls below a threshold.

7. The electrical switch of claim 1, further comprising an AC amplifier circuit electrically coupled between the input of the voltage supervisor and an input terminal of the switch, the input terminal configured to receive an input from the power source.

8. The electrical switch of claim 1, wherein the light source comprises a light-emitting diode.

* * * * *